(12) United States Patent
Su et al.

(10) Patent No.: US 9,391,195 B2
(45) Date of Patent: Jul. 12, 2016

(54) HIGH SIDE GATE DRIVER DEVICE

(71) Applicant: TAIWAN SEMICONDUCTOR MANUFACTURING COMPANY, LTD., Hsin-Chu (TW)

(72) Inventors: Ru-Yi Su, Kouhu Township (TW); Fu-Chih Yang, Fengshan (TW); Chun Lin Tsai, Hsin-Chu (TW); Ker Hsiao Huo, Taichung (TW); Chih-Chang Cheng, Hsinchu (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 201 days.

(21) Appl. No.: 14/074,802

(22) Filed: Nov. 8, 2013

(65) Prior Publication Data
US 2014/0054695 A1    Feb. 27, 2014

Related U.S. Application Data

(62) Division of application No. 12/959,538, filed on Dec. 3, 2010, now Pat. No. 8,680,616.

(51) Int. Cl.
| | |
|---|---|
| *H01L 21/00* | (2006.01) |
| *H01L 29/78* | (2006.01) |
| *H01L 21/762* | (2006.01) |
| *H01L 29/10* | (2006.01) |
| *H01L 29/423* | (2006.01) |

(Continued)

(52) U.S. Cl.
CPC ...... *H01L 29/7816* (2013.01); *H01L 21/76202* (2013.01); *H01L 29/1095* (2013.01); *H01L 29/42368* (2013.01); *H01L 29/861* (2013.01); *H01L 27/0629* (2013.01); *H01L 29/0696* (2013.01)

(58) Field of Classification Search
CPC ................ H01L 29/7816; H01L 29/42368; H01L 29/861
See application file for complete search history.

(56) References Cited

U.S. PATENT DOCUMENTS

| 6,110,804 A | 8/2000 | Parthasarathy et al. |
| 6,424,005 B1 | 7/2002 | Tsai et al. |

(Continued)

OTHER PUBLICATIONS

Masaharu Yamaji et al., "A Novel 600V-LDMOS with HV-Interconnection for HVIC on Thick SOI", Proceedings of the 22$^{nd}$ International Symposium on Power Semiconductor Devices & ICs, Hiroshima, pp. 101-104.

(Continued)

*Primary Examiner* — Laura Menz
(74) *Attorney, Agent, or Firm* — Haynes and Boone, LLP

(57) ABSTRACT

The present disclosure provides a semiconductor device. The semiconductor device includes: a drift region having a first doping polarity formed in a substrate; a doped extension region formed in the drift region and having a second doping polarity opposite the first doping polarity, the doped extension region including a laterally-extending component; a dielectric structure formed over the drift region, the dielectric structure being separated from the doped extension region by a portion of the drift region; a gate structure formed over a portion of the dielectric structure and a portion of the doped extension region; and a doped isolation region having the second doping polarity, the doped isolation region at least partially surrounding the drift region and the doped extension region.

20 Claims, 4 Drawing Sheets

(51) Int. Cl.
*H01L 29/861* (2006.01)
*H01L 27/06* (2006.01)
*H01L 29/06* (2006.01)

(56) References Cited

U.S. PATENT DOCUMENTS

| | | | |
|---|---|---|---|
| 6,879,005 | B2 | 4/2005 | Yamaguchi et al. |
| 7,973,382 | B2 | 7/2011 | Takahashi |
| 8,168,466 | B2 | 5/2012 | Quddus et al. |
| 8,288,235 | B2 * | 10/2012 | Verma .................. H01L 21/743 257/E21.409 |
| 8,445,960 | B2 | 5/2013 | Verma |
| 8,546,889 | B2 | 10/2013 | Yamaji |
| 2011/0316078 | A1 | 12/2011 | Kim et al. |
| 2012/0139041 | A1 | 6/2012 | Su et al. |
| 2012/0181629 | A1 | 7/2012 | Su et al. |

OTHER PUBLICATIONS

S. L. Kim et al., "Realization of Robust 600V High Side Gate Drive IC with a New Isolated Self-Shielding Structure," Proceedings of the 17th International Symposium on Power Semiconductor Devices & ICs, May 23-26, 2005, Santa Barbara, CA, USA, pp. 1-4.

* cited by examiner

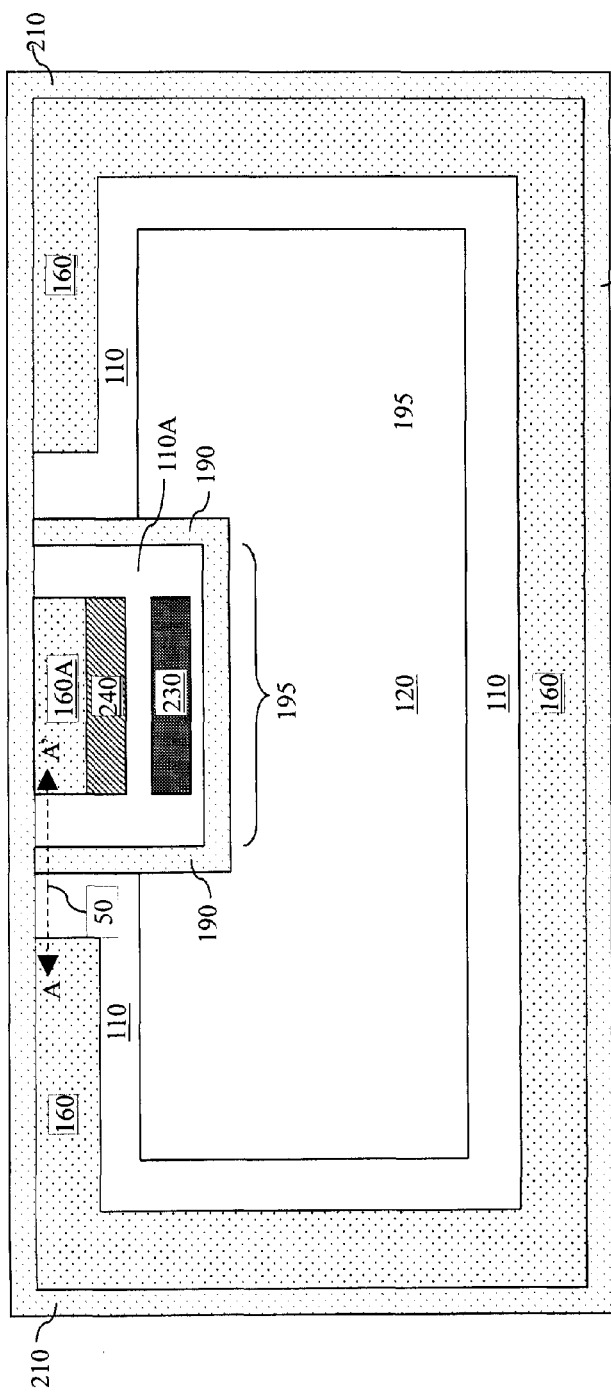
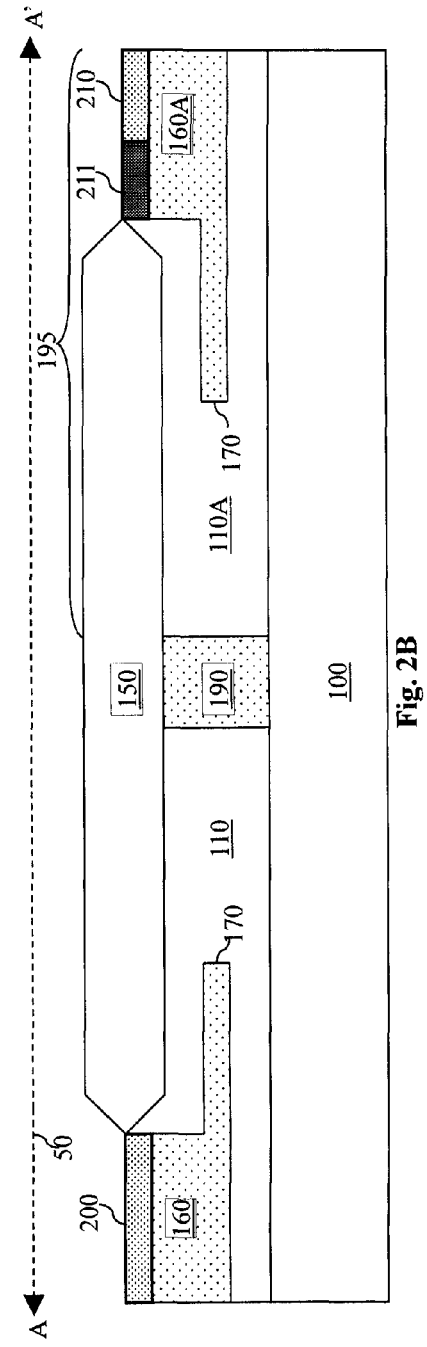
Fig. 2A
Fig. 2B

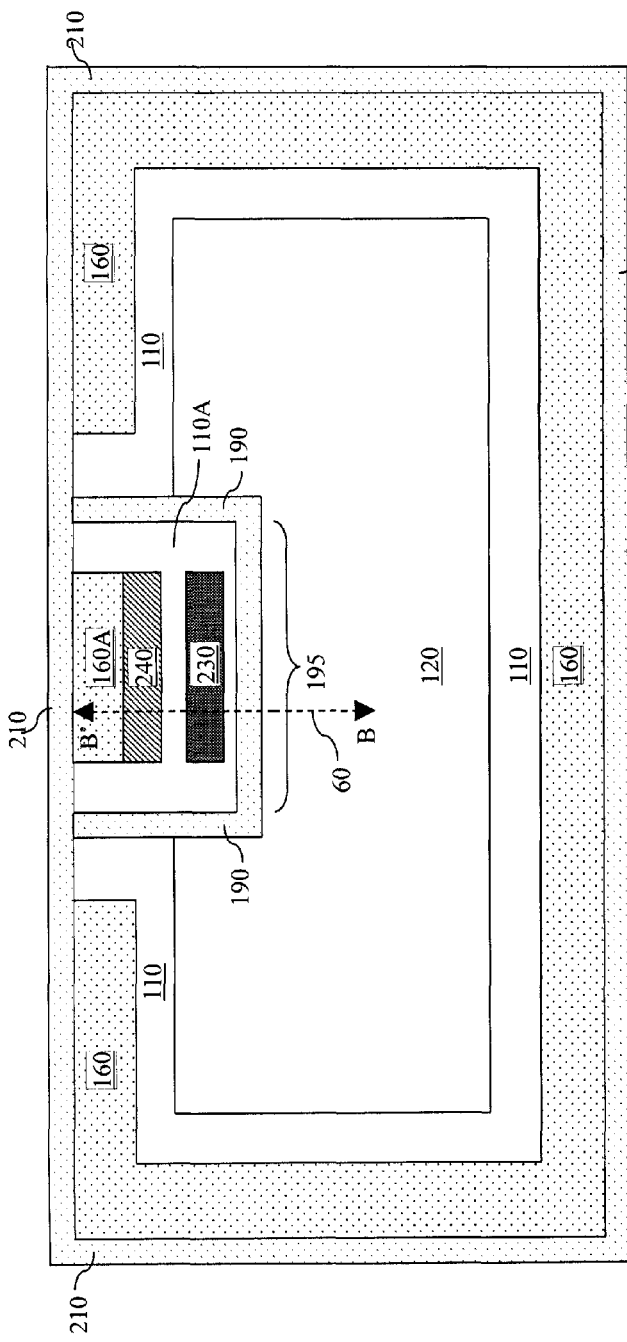
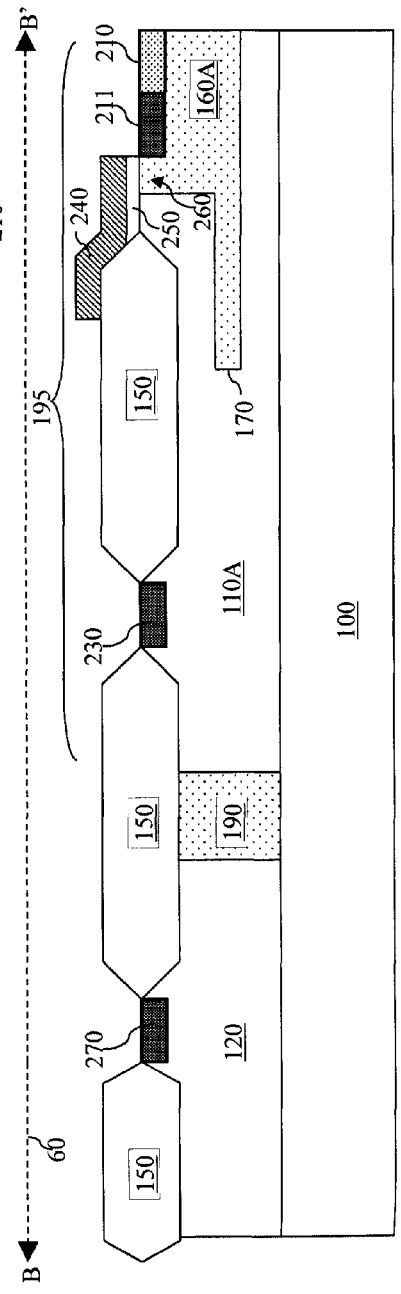
Fig. 3A
Fig. 3B

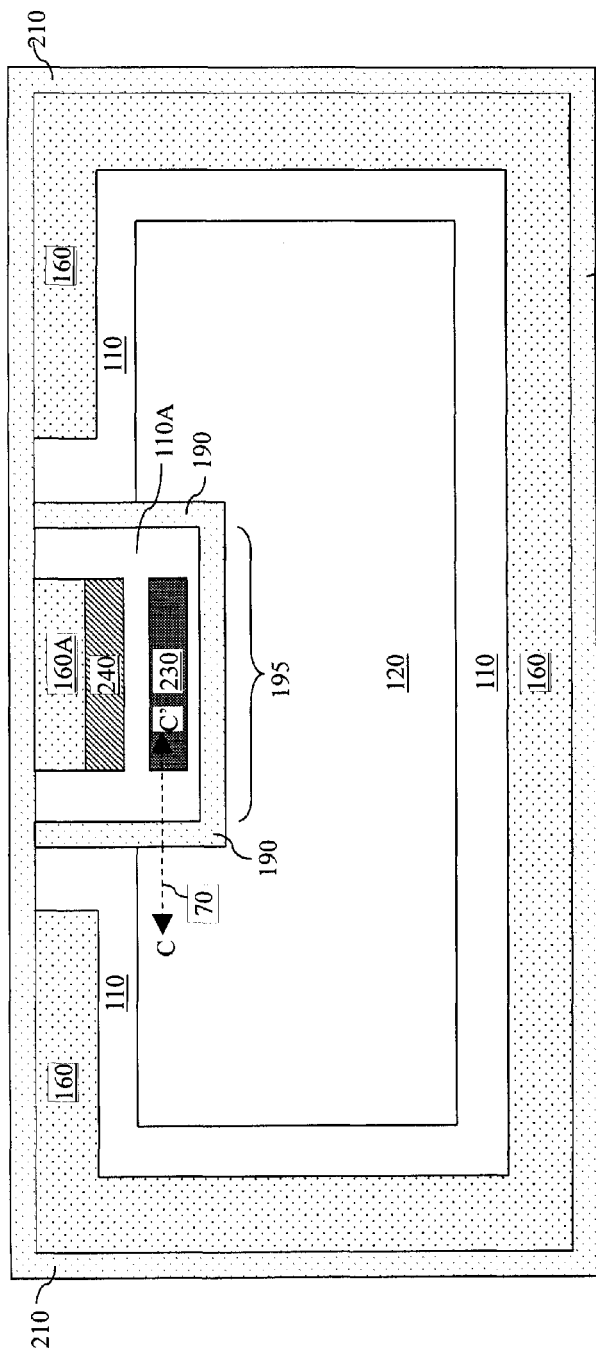
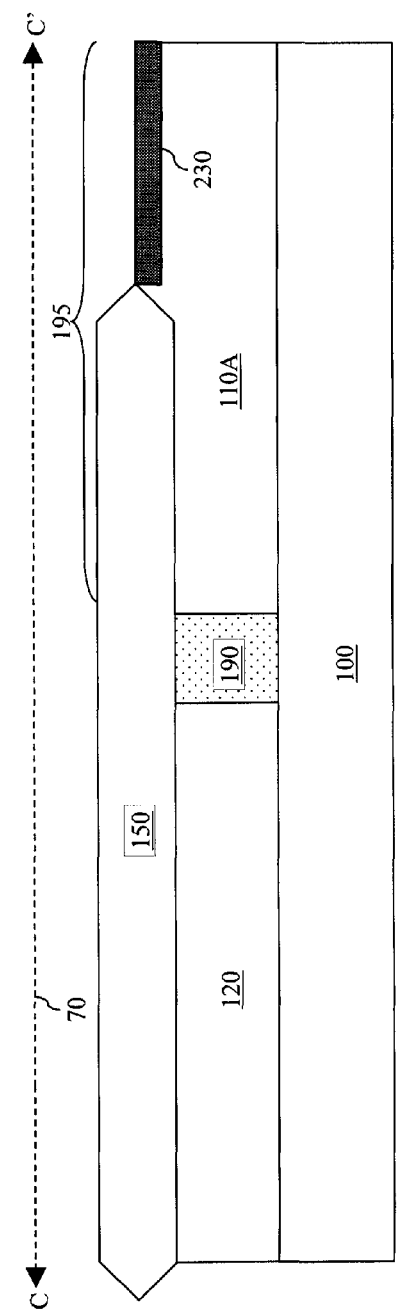
Fig. 4A
Fig. 4B

US 9,391,195 B2

HIGH SIDE GATE DRIVER DEVICE

PRIORITY DATA

The present application is a divisional patent application of U.S. patent application Ser. No. 12/959,538, filed on Dec. 3, 2010, entitled "High Side Gate Driver Device", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

These ICs include high-voltage devices, such as high side gate driver (HSGD) devices. As geometry size continues to be scaled down, it has become increasingly more difficult for existing high side gate driver devices to achieve chip area efficiency. In addition, traditional methods of fabricating the high side gate driver devices may involve complicated fabrication processes.

Therefore, while existing high side gate driver devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-4A are diagrammatic fragmentary top views of a high side gate driver device according to various aspects of the present disclosure.

FIGS. 2B-4B are diagrammatic fragmentary cross-sectional side views of the high side gate driver device shown in FIGS. 2A-4A according to various aspects of the present disclosure.

DETAILED DESCRIPTION

Figure 1:
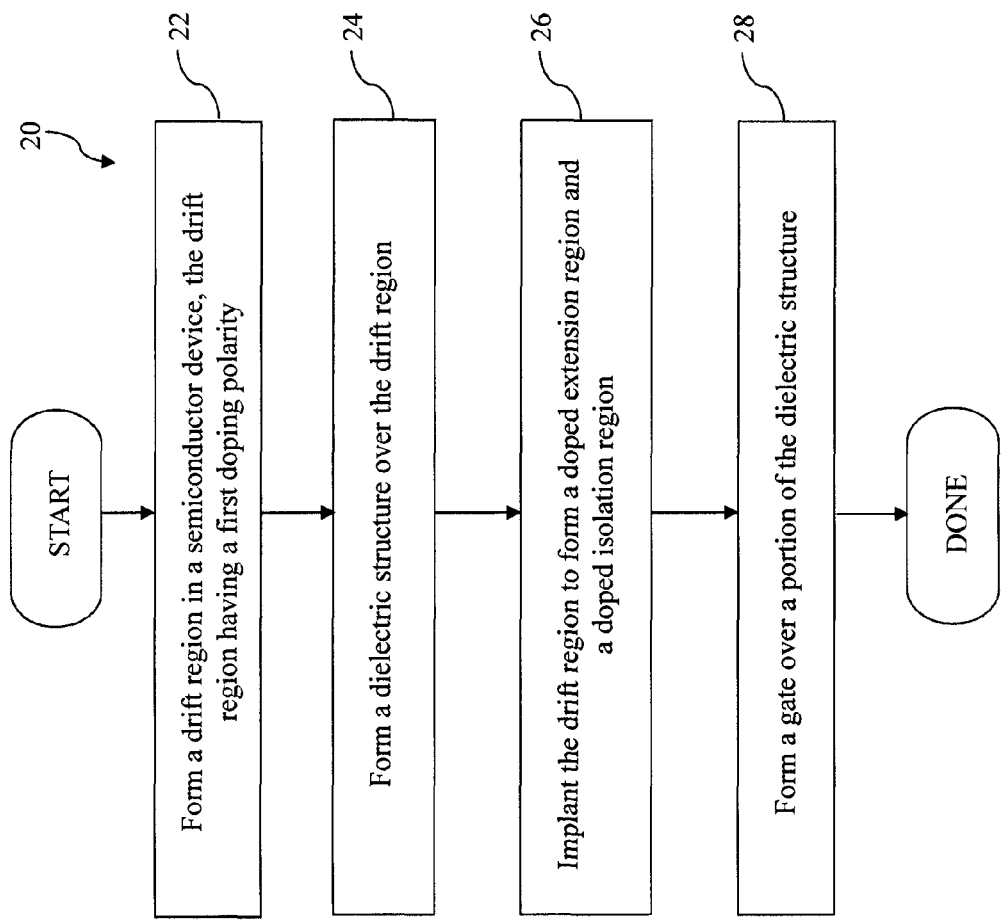
FIG. 1 is a flowchart illustrating a method of fabricating a high side gate driver device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 20 for fabricating a semiconductor transistor device. It should be noted that additional processes may be provided before, during, and after the method 20 of FIG. 1, and that some other processes may only be briefly described herein.

Referring to FIG. 1, the method 20 begins with block 22 in which a drift region is formed in a semiconductor substrate. The drift region has a first doping polarity. The method 20 continues with block 24 in which a dielectric structure is formed over the drift region. The method 20 continues with block 26 in which the drift region is implanted to form a doped extension region and a doped isolation region. The doped extension region has a portion that extends laterally toward the drift region. The doped extension region has a second doping polarity opposite the first doping polarity. The doped isolation region at least partially surrounds a portion of the drift region. The method 20 continues with block 28 in which a gate is formed over a portion of the dielectric structure.

FIGS. 2A-4A and 2B-4B have been simplified for a better understanding of the inventive concepts of the present disclosure. FIGS. 2A and 2B are a diagrammatic fragmentary top view and a diagrammatic fragmentary cross-sectional side view, respectively, of a portion of a high side gate driver (HSGD) device according to various aspects of the present disclosure. FIG. 2B approximately represents the cross-sectional view that is seen by cutting the top view of FIG. 2A along a cutline 50 (spanning from point A to A' in FIGS. 2A and 2B). Similarly, FIGS. 3B and 4B approximately represent the cross-sectional view that is seen by cutting the top view of FIGS. 3A and 4A along a cutline 60 (spanning from point B to B' in FIGS. 3A and 3B) and a cutline 70 (spanning from point C to C' in FIGS. 4A and 4B), respectively. It is understood, however, that FIGS. 2A-4A and FIGS. 2B-4B are each simplified for the sake of simplicity, and FIGS. 2A-4A may not have an exact one-to-one correspondence with FIGS. 2B-4B.

Referring to the cross-sectional view of FIG. 2B, the high side gate driver device includes a substrate 100. The substrate 100 is a semiconductor substrate in the present embodiment. For example, the substrate 100 may be a silicon substrate. The substrate 100 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The portion of the substrate 100 shown in FIG. 2B is doped with a P-type dopant, such as boron. In an alternative embodiment, the substrate 100 may be doped with an N-type dopant, such as arsenic or phosphorous. The substrate 100 may also include an epi-layer formed at the top.

Referring to FIGS. 2A and 2B, a drift region 110 is formed in the substrate 100. The drift region 110 is formed near an upper surface of the substrate 100 and has an opposite doping polarity as the substrate 100. Thus, in the embodiment where the substrate 100 is P-type doped, the drift region 110 is N-type doped, and as such may be referred to as an N-drift region 110. The drift region 110 is formed by an implantation process (which may include one or more implantation steps) known in the art. In an embodiment, the implantation process may use phosphorous as a dopant and uses an implantation dosage that is in a range between about $1\times10^{15}$ ions/cm$^2$ and about $5\times10^{15}$ ions/cm$^2$.

A high side implant region (also referred to as a high voltage region) 120 is formed in the substrate. The high side implant region 120 is also formed near an upper surface of the substrate 100 and has an opposite doping polarity as the substrate 100. Thus, in the embodiment where the substrate 100 is P-type doped, the high side implant region 120 is N-type doped, and as such may be referred to as a high side N-region 120. The high side implant region 120 is formed by an implantation process (which may include one or more implantation steps) known in the art. The implantation process may use an implantation dosage that is greater than the implantation dosage used to form the drift region 100. In other words, the high side implant region 120 has a higher dopant concentration level than the drift region 110. In an embodiment, the high side implant region 120 is formed by an implantation process that uses phosphorous as a dopant and uses an implantation dosage that is in a range between about $1\times10^{15}$ ions/cm$^2$ and about $1\times10^{16}$ ions/cm$^2$.

As is shown in the top view of FIG. 2A, the drift region 110 substantially (or at least partially) surrounds the high side implant region 120. The high side implant region 120 has an approximately rectangular top view profile in FIG. 2A, and the drift region 110 has an approximately rectangular ring-like top view profile in FIG. 2A. However, these top view profiles are merely exemplary, and it is understood that the high side implant region 120 and the drift region 110 may each have differently-shaped top view profiles in other embodiments.

Recall that the cross-sectional view of FIG. 2B is taken along the cutline 50 from point A to point A', and the cutline does not overlap with the high side implant region 120. Therefore, the high side implant region 120 is not shown in the cross-sectional view of FIG. 2B. A cross-sectional view of the high side implant region 120 will be shown in FIGS. 3B and 4B.

Still referring to FIG. 2B, a plurality of dielectric structures such as the dielectric structure 150 is formed at the upper surface of the substrate 100. In one embodiment, the dielectric structure 150 includes a local oxidation of silicon (LOCOS) device. In an alternative embodiment, the dielectric structure 150 may include a shallow trench isolation (STI) device instead. At least a portion of the dielectric structure 150 is formed in (or extends downwardly into) the drift region 110. The dielectric structure 150 helps define boundaries of certain doped regions to be formed later, for example boundaries of source and drain regions. The dielectric structure 150 is not illustrated in the top view of FIG. 2A for reasons of simplicity and clarity.

A doped extension region 160 is formed in the substrate 100. The doped extension region 160 has the same doping polarity as the substrate 100 but an opposite doping polarity as the drift region 110 or the high side implant region 120. Thus, in the embodiment shown, the doped extension region 160 has a P-type doping polarity.

The doped extension region 160 may be formed by two separate ion implantation processes. The first ion implantation process forms a doped region at least partially in the upper portion of the drift region 110 (near the upper surface of the drift region 110). The second ion implantation process forms a deeper and wider doped region that "extends" or "protrudes" laterally outward. Subsequently, a thermal process may be performed to inter-diffuse and merge the two doped regions into a single doped region, thereby forming the doped extension region 160. As a result, the doped extension region 160 has a protruding portion 170 (or protruding tip) that laterally extends or protrudes partially into the drift region 110. As such, the doped extension region 160 may also be referred to as a P-body extension region 160 herein. As is shown in FIG. 2B, the protruding portion 170 is buried deep inside the drift region 110, rather than being located near the upper surface of the drift region 110. In other words, the protruding portion 170 is located away from the surface of the drift region 110. One benefit offered by the protruding portion 170 is that it can provide extra conduction path to reduce an on-state resistance of a transistor.

From the top view of FIG. 2A, it can be seen that the doped extension region 160 partially surrounds the high side implant region 120, since the doped extension region 160 is formed in the drift region 110. The drift region 110, the doped extension region 160, and the substrate 100 underneath can collectively be referred to as a high-voltage junction termination (HVJT) region. Thus, the HVJT region surrounds the high side implant region 120 in the top view as well. From the top view, the HVJT has a ring-like profile that approximately resembles a track in a stadium. The track may be somewhat rectangular in some embodiments or somewhat oval in other embodiments. The HVJT includes a P/N junction formed by the interface between the drift region 110 and the doped extension region 160. Thus, the HVJT includes a diode structure.

Using the same implantation processes that form the doped extension region 160, a doped isolation region 190 is also formed. In an embodiment, the doped isolation region 190 is formed using the second ion implantation process (the one that forms the wider and deeper doped region). To define the lateral size of the doped isolation region, a patterned photoresist mask layer may be formed that has an opening, and the above-mentioned second ion implantation process may be performed through the opening (and through the dielectric structure 150) to define the doped isolation region 190. Stated differently, the doped isolation region 190 is also formed during the formation of the protruding portion 170 of the doped extension region 160. Thus, the doped isolation region 190 may have a dopant concentration level that is approximately the same as the dopant concentration level of the protruding portion 170.

The doped isolation region 190 also has a ring-like top view profile. As shown in the top view of FIG. 2A, the doped isolation region 190 at least partially surrounds a portion of the doped extension region 160 and a portion of the drift region 110. In order to differentiate these surrounded portions of the doped extension region and the drift region from portions that are outside the doped isolation region 190, the surrounded portion of the doped extension region is designated with the reference numeral 160A, and the surrounded portion of the drift region is designated with the reference numeral 110A. A high-voltage transistor device will be formed inside the area surrounded by the doped isolation region 190. The high-voltage transistor device is a part of an ultra-high voltage (UHV) level shifter device 195, which will be discussed in more detail later.

Referring to the cross-sectional view of FIG. 2B, the doped isolation region 190 divides the drift region 110 into two neighboring drift regions 110 and 110A. In an embodiment, the doped isolation region 190 extends vertically (in a cross-sectional view) through the drift region 110. In other words, the doped isolation region spans from the bottom of the dielectric structure 150 to the top of the substrate 100.

Still referring to the cross-sectional view of FIG. 2B, a heavily doped region 200 is formed at the upper surface of the doped extension region 160 near the point "A", and heavily doped regions 210-211 are formed at the upper surface of the doped extension region 160A near the point "A'". The heavily doped regions 200 and 210 have the same doping polarity as the doped extension region 160, and the heavily doped region 211 has the same doping polarity as the drift region 110. Thus, in the embodiment shown in FIG. 2B, the heavily doped regions 200 and 210 are P-type doped, and the heavily doped region 211 is N-type doped. The heavily doped regions 200 and 210 have dopant concentration levels that are much higher than the dopant concentration level of the doped extension region 160. The heavily doped region 211 has a dopant concentration level that is much higher than the dopant concentration level of the drift region 110. Therefore, in the embodiment shown, the heavily doped regions 200 and 210 may be referred to as P+ regions, and the heavily doped region 211 may be referred to as an N+ region.

The heavily doped region 200 serves as a terminal for the diode of the HVJT. The heavily doped region 210 forms a guard ring that surrounds the entire high side gate driver device, as shown in the top view. The heavily doped region 211 serves as a source region for the high voltage transistor device mentioned above. Thus, the heavily doped region 211 may also be referred to as a source region 211, and is a part of the UHV level shifter device 195. For reasons of simplicity and clarity, these heavily doped regions 200 and 210-211 are not illustrated in the top view of FIG. 2A.

Referring to the top view of FIG. 2A, a drain region 230 is formed in the area of the drift region 110A. The drain region 230 has the same doping polarity as the source region 211 and has a dopant concentration level that is similar to (or on par with) the dopant concentration level of the source region 211. The drain region 230 serves as the drain of the UHV level shifter device 195. The UHV level shifter device 195 also includes a gate 240. From the top view of FIG. 2A, it can be seen that the gate 240 is located between the doped extension region 160A and the drain region 230. In more detail, the doped extension region 160A and the gate 240 partially overlap in the top view, but a portion of the drift region 110A still separates the gate 240 from the drain region 230. The cross-sectional views of the gate 240 and the drain region 230 are not illustrated in FIG. 2B, since they are located outside the cutline 50. The cross-sectional views of the gate 240 and the drain region 230 are shown in FIG. 3B.

Referring now to FIG. 3B, as discussed above, the cross-sectional view of FIG. 3B is approximately obtained by cutting the top view of FIG. 3A along the cutline 60 spanning from point B to point B'. Thus, FIG. 3B represents a different cross-sectional view than what is shown in FIG. 2B, though the top views of FIGS. 2A and 3A are substantially the same. For the sake of consistency, similar components are labeled the same throughout all the figures herein.

The cutline 60 runs through the UHV level shifter device 195, including the drain region 230 and the gate 240. Thus, the drain region 230 and the gate 240 appear in the cross-sectional view of FIG. 3B. As discussed above, the drain region 230 is a heavily doped region that has the same doping polarity as the drift region 110 (or opposite the substrate 100). Thus, the drain region 230 is an N+ region in the embodiment shown. The drain region 230 is formed at the upper surface of the drift region 110 and between two adjacent dielectric isolation structures 150.

The gate 240 is formed partially over the dielectric structure 150, partially over the drift region 110A, and partially over the doped extension region 160. Stated differently, the gate 240 partially overlaps with the dielectric structure 150, the drift region 110A, and the doped extension region 160. It is understood that a high-voltage dielectric layer 250 may be formed underneath the gate 240. In one embodiment, the high-voltage dielectric layer 250 includes silicon oxide. The high-voltage dielectric layer 250 may serve as a gate dielectric of the gate 240. When the UHV level shifter device 195 is in operation, a conductive channel region 260 will be formed in the upper portion of the doped extension region 160A underneath this gate dielectric 250.

The gate 240 is located much closer to the source region 211 than to the drain region 230. This is partially due to the fact that the drain region 230 will have to handle a high voltage on the order of several hundred volts. As such, it is desirable to move the drain region 230 farther out and away from the gate 240 (and the channel 260) for electric field considerations. As is shown in FIG. 3B, a side of the gate 240 may be substantially vertically aligned with a side of the source region 211, while the gate 240 is separated from the drain region 230 by the dielectric structure 150 and/or a significant portion of the doped extension region 110A.

For purposes of providing an illustration, an anode 270 is also shown in the cross-sectional view of FIG. 3B. The anode 270 is formed somewhere at an upper surface of the high side implant region 120 and is separated or isolated from the drain region 230 by the doped isolation region 190. In reality, the anode 270 may be formed at any point of the upper surface of the high side implant region 120. Thus, the anode 270 is not specifically illustrated in the top view of FIG. 3A.

Referring now to FIG. 4B, a different cross-sectional view is obtained by cutting the top view of FIG. 4A along the cutline 70. The cutline 70 extends into the drain region 230, therefore the drain region 230 is shown in FIG. 4B. Also shown in FIG. 4B is that the doped isolation region 190 isolates the drift region 110A from the high side implant region 120.

The overall device illustrated in FIGS. 2A-4A and 2B-4B is a high side gate driver device, which is used in high voltage operations. The electrical circuitry (not shown herein) of the high side gate driver will be implemented in the high side implant region 120. The UHV level shifter device 195 is used to push a relatively low voltage signal onto a relatively high voltage signal to operate with the electrical circuitry of the high side gate driver. For example, the UHV level shifter device 195 can push a 5 volt signal onto a high voltage signal in a range between about 600 volts and about 620 volts.

In an embodiment, the source region 211 (FIG. 3B) of the UHV level shifter device 195 is coupled to a voltage level of approximately zero. In other words, the source region 211 is grounded. The gate 240 is coupled to a voltage level in a range from about 0 volts to about 20 volts. The drain region 230 is coupled to a voltage level in a range from about 0 volts to about 600 volts. The anode (shown as an example in FIG. 3B as 270 but not shown in the top views of FIGS. 2A-4A) that is located in the high side implant region 120 is coupled to a voltage level in a range from about 0 volts to about 620 volts. Thus, an input voltage at the gate 240 may be transformed from a low voltage level of about 0-20 volts to a high voltage level as high as about 600 volts at the drain 230. The HVJT region—which includes the drift region 110, the high side implant region 120, and the substrate 100 underneath—helps the device withstand such high voltage.

Although the figures discussed above illustrate a single UHV level shifter device 195, it is understood that additional UHV level shifter devices (that are similar to the UHV level shifter device 195) may be implemented in the same high side gate driver device. It is also understood that other fabrication processes may be performed to complete the fabrication of the high side gate driver device. For example, these additional fabrication processes may include forming an interlayer dielectric (ILD), forming metal layers and vias interconnecting the metal layers, performing passivation processes, packaging, and testing. For the sake of simplicity, these additional processes are not illustrated herein.

The embodiments of the present disclosure described above offer advantages over existing high side gate driver devices. It is understood, however, that other embodiments may offer different advantages, and that no particular advantage is required for all embodiments. One advantage is reduced chip area. Many existing high voltage devices require an external level shifter device, which wastes chip area and leads to high fabrication costs. In comparison, as shown in the top views discussed above, the UHV level shifter device 195 of the present disclosure is implemented "within" the HVJT region. This implementation scheme saves valuable chip area and therefore reduces fabrication costs.

Another advantage is simplified fabrication processes. The HVJT region and the UHV level shifter device 195 each contain a doped extension region 160/160A (the P-body extension). The protruding portion 170 of the doped extension region 160/160A is easy to form using the twice implantation technique described above. Other existing high voltage gate drivers may have an additional doped region that is physically separate from the doped portion underneath the source region, which may involve extra process flow. Furthermore, in existing devices, the physically-separate doped region may be formed close to the surface of the drift region, which is undesirable. In comparison, the protruding portion 170 is buried inside the drift region 110, and is away from the surface of the drift region 110. As mentioned previously, one benefit offered by the protruding portion 170 is that it can provide extra conduction path to reduce an on-state resistance of the transistor that is a part of the UHV level shifter device 195.

In addition, the doped isolation region 190 of the present disclosure is also formed using the same processes that form the doped extension region 160. Hence, the UHV level shifter device 195, the HVJT region, and the doped isolation region 190 all utilize the same fabrication process, which simplifies fabrication process flow and saves processing time.

One of the broader forms of the present disclosure involves a semiconductor device. The semiconductor device includes a drift region having a first doping polarity formed in a substrate. The semiconductor device includes a doped extension region formed in the drift region and having a second doping polarity opposite the first doping polarity. The doped extension region includes a laterally-extending component. The semiconductor device includes a dielectric structure formed over the drift region. The dielectric structure is separated from the doped extension region by a portion of the drift region. The semiconductor device includes a gate structure formed over a portion of the dielectric structure and a portion of the doped extension region. The semiconductor device includes a doped isolation region having the second doping polarity. The doped isolation region at least partially surrounds the drift region and the doped extension region.

Another one of the broader forms of the present disclosure involves a semiconductor device. The semiconductor device includes a high voltage region having a first doping polarity formed over a substrate. The semiconductor device includes a drift region that at least partially surrounds the high voltage region. The drift region has the first doping polarity and a different dopant concentration level than the high voltage region. The semiconductor device includes a doped extension region that at least partially surrounds the drift region. The doped extension region has a second doping polarity opposite the first doping polarity. The doped extension region has a tip that protrudes into the drift region. The semiconductor device includes a doped isolation region that at least partially surrounds a portion of the drift region and isolates the portion of the drift region from the high voltage region. The doped isolation region has the second doping polarity.

Yet one more of the broader forms of the present disclosure involves a method of fabricating a semiconductor device. The method includes forming a drift region in a semiconductor substrate. The drift region has a first doping polarity. The method includes forming a dielectric structure over the drift region. The method includes implanting the drift region to form a doped extension region and a doped isolation region. The doped extension region has a portion that extends laterally toward the drift region. The doped extension region has a second doping polarity opposite the first doping polarity. The doped isolation region at least partially surrounds a portion of the drift region. The method includes forming a gate over a portion of the dielectric structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further embodiments may also include, but are not limited to, vertical diffused metal-oxide-semiconductor (VDMOS), other types of high power MOS transistors, Fin structure field effect transistors (FinFET), and strained MOS structures.

What is claimed is:

1. A semiconductor device, comprising:
    a drift region having a first doping polarity formed in a substrate;
    a doped extension region formed in the drift region and having a second doping polarity opposite the first doping polarity, the doped extension region including a laterally-extending component;
    a dielectric structure formed over the drift region, the dielectric structure being separated from the doped extension region by a portion of the drift region;
    a gate structure formed over a portion of the dielectric structure and a portion of the doped extension region, the gate structure including a gate dielectric component that is separate from the dielectric structure; and
    a doped isolation region having the second doping polarity, wherein the doped isolation region at least partially surrounds the drift region and the doped extension region in a top view;
    wherein the laterally-extending component is disposed below, but not in direct contact with, the dielectric structure.

2. The semiconductor device of claim 1, wherein the laterally-extending component of the doped extension region is located substantially away from a surface of the drift region.

3. The semiconductor device of claim 1, further including:
    a drain region formed in the drift region, the drain region having the first doping polarity and being more doped than the drift region; and a source region formed in the doped extension region, the source region having the first doping polarity and being more doped than the drift region;

wherein: the drain and source regions are located on opposite sides of the dielectric structure and on opposite sides of the gate structure;

the drain region is substantially spaced apart from the gate structure;

the drain region is configured to handle a voltage as high as several hundred volts; and a side of the source region is approximately vertically aligned with a side of the gate structure.

4. The semiconductor device of claim 1, further including a high voltage region that is located outside the drift region and the doped extension region but borders the doped isolation region, the high voltage region having the first doping polarity and being more doped than the drift region.

5. The semiconductor device of claim 4, wherein the drift region is a first drift region, and further including a second drift region that at least partially surrounds the high voltage region from a top view, the second drift region having the first doping polarity and being less doped than the first drift region.

6. The semiconductor device of claim 5, wherein the doped extension region is a first doped extension region, and further including a second doped extension region that at least partially surrounds the second drift region, the second doped extension region having the second doping polarity and also including a laterally-extending component.

7. The semiconductor device of claim 6, further including a guard ring region that at least partially surrounds the second drift region and the second doped extension region, the guard ring having the second doping polarity.

8. A semiconductor device, comprising:
a drift region having a first doping polarity formed in a substrate;
a doped extension region formed in the drift region and having a second doping polarity opposite the first doping polarity, the doped extension region including a laterally-extending component;
a dielectric structure formed over the drift region, the dielectric structure being separated from the doped extension region by a portion of the drift region;
a gate structure formed over a portion of the dielectric structure and a portion of the doped extension region, the gate structure including a gate dielectric layer that is different from the dielectric structure; and
a doped isolation region having the second doping polarity, the doped isolation region at least partially surrounding the drift region and the doped extension region;
wherein the laterally-extending component is located beneath, but not in physical contact with, the dielectric structure.

9. The semiconductor device of claim 8, and further including a high voltage region that is located outside the drift region and the doped extension region but borders the doped isolation region, the high voltage region having the first doping polarity and being more doped than the drift region, wherein the high voltage region is configured to tolerate a high voltage as high as several hundred volts.

10. The semiconductor device of claim 9, wherein the drift region is a first drift region, and further including a second drift region that at least partially surrounds the high voltage region from a top view, the second drift region having the first doping polarity and being less doped than the first drift region.

11. The semiconductor device of claim 10, wherein the doped extension region is a first doped extension region, and further including a second doped extension region that at least partially surrounds the second drift region, the second doped extension region having the second doping polarity and also including a laterally-extending component.

12. The semiconductor device of claim 11, further including a guard ring region that at least partially surrounds the second drift region and the second doped extension region, the guard ring having the second doping polarity.

13. A semiconductor device, comprising:
a drift region disposed in a substrate, the drift region having a first type of conductivity;
a doped extension region disposed in the drift region, the doped extension region having a second type of conductivity different from the first type, wherein the doped extension region includes a laterally-protruding portion;
a dielectric structure disposed over the drift region, the dielectric structure being separated from the doped extension region by a portion of the drift region;
a gate structure disposed over a portion of the drift region, a portion of the doped extension region, and a portion of the dielectric structure, wherein the gate structure includes a gate dielectric component that is separate from the dielectric structure;
a drain region formed in the drift region and not covered by the dielectric structure, the drain region having the first type of conductivity and being more doped than the drift region;
a source region formed in the doped extension region and adjacent to the gate structure, the source region having the first type of conductivity and being more doped than the drift region; and
a doped isolation region disposed below the dielectric structure, wherein the doped isolation region has the second type of conductivity, and wherein the doped isolation region partially encircles the drift region and the doped extension region in a top view;
wherein the laterally-protruding portion is disposed under, but free of being in direct contact with, the dielectric structure.

14. The semiconductor device of claim 13, wherein the drain region and the source region are disposed on opposite sides of the gate structure, and wherein the drain region is configured to handle a voltage as high as several hundred volts.

15. The semiconductor device of claim 13, and wherein the semiconductor device further includes a high voltage region that is located outside the drift region and the doped extension region but borders the doped isolation region, the high voltage region having the first type of conductivity and being more doped than the drift region.

16. The semiconductor device of claim 15, wherein the drift region is a first drift region, and wherein the semiconductor device further includes a second drift region that at least partially encircles the high voltage region in the top view, the second drift region having the first type of conductivity and being less doped than the first drift region.

17. The semiconductor device of claim 16, wherein the doped extension region is a first doped extension region, and wherein the semiconductor device further includes a second doped extension region that at least partially encircles the second drift region in the top view, the second doped extension region having the second type of conductivity and also including a laterally-protruding portion.

18. The semiconductor device of claim 17, further including a guard ring region that at least partially encircles the second drift region and the second doped extension region in the top view, the guard ring having the second type of conductivity.

19. The semiconductor device of claim 1, wherein the gate structure is disposed partially over the gate dielectric component and partially over the dielectric structure.

20. The semiconductor device of claim 1, wherein a bottom surface of the dielectric structure is disposed below a top surface of the drift region.

* * * * *